United States Patent
Shim et al.

(10) Patent No.: US 12,021,036 B2
(45) Date of Patent: *Jun. 25, 2024

(54) SEMICONDUCTOR PACKAGE INCLUDING INTERPOSER AND METHOD OF MANUFACTURING THE SEMICONDUCTOR PACKAGE

(71) Applicant: Samsung Electronics Co., Ltd., Suwon-si (KR)

(72) Inventors: Jongbo Shim, Asan-si (KR); Jihwang Kim, Cheonan-si (KR); Choongbin Yim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/986,169

(22) Filed: Nov. 14, 2022

(65) Prior Publication Data

US 2023/0075292 A1 Mar. 9, 2023

Related U.S. Application Data

(63) Continuation of application No. 17/150,232, filed on Jan. 15, 2021, now Pat. No. 11,521,934.

(30) Foreign Application Priority Data

Jul. 9, 2020 (KR) .................. 10-2020-0084943

(51) Int. Cl.
*H01L 23/538* (2006.01)
*H01L 23/00* (2006.01)
(Continued)

(52) U.S. Cl.
CPC ...... *H01L 23/5389* (2013.01); *H01L 23/3128* (2013.01); *H01L 23/5383* (2013.01);
(Continued)

(58) Field of Classification Search
CPC ............ H01L 23/5389; H01L 23/3128; H01L 23/5383; H01L 23/5386; H01L 24/20;
(Continued)

(56) References Cited

U.S. PATENT DOCUMENTS 8,067,695 B2 11/2011 Kaneko
9,337,135 B2 5/2016 Lii et al.
(Continued)

FOREIGN PATENT DOCUMENTS

KR 10-1515613 B1 4/2015
KR 10-1653563 B1 9/2016

*Primary Examiner* — Fernando L Toledo
*Assistant Examiner* — Neil R Prasad
(74) *Attorney, Agent, or Firm* — Muir Patent Law, PLLC

(57) ABSTRACT

A semiconductor package comprises a package substrate, a semiconductor chip on the package substrate, and an interposer substrate on the semiconductor chip. The interposer substrate comprises a first surface facing the semiconductor chip and a trench in the first surface, the trench vertically overlapping the semiconductor chip. An insulating filler is provided between the semiconductor chip and the interposer substrate, and at least partially fills the trench of the interposer substrate.

20 Claims, 13 Drawing Sheets

(51) Int. Cl.
*H01L 23/31* (2006.01)
*H01L 25/10* (2006.01)

(52) U.S. Cl.
CPC .......... *H01L 23/5386* (2013.01); *H01L 24/20* (2013.01); *H01L 25/105* (2013.01); *H01L 2224/214* (2013.01); *H01L 2225/1035* (2013.01); *H01L 2225/1041* (2013.01); *H01L 2225/1058* (2013.01)

(58) Field of Classification Search
CPC ............. H01L 25/105; H01L 2224/214; H01L 2225/1035; H01L 2225/1041; H01L 2225/1058
See application file for complete search history.

(56) References Cited

U.S. PATENT DOCUMENTS

| | | |
|---|---|---|
| 9,478,500 B2 | 10/2016 | Chen et al. |
| 9,480,190 B2 | 10/2016 | Seo |
| 9,691,636 B2 | 6/2017 | Wu |
| 10,074,630 B2 | 9/2018 | Kelly et al. |
| 10,431,536 B2 | 10/2019 | Kim et al. |
| 2012/0083073 A1 | 4/2012 | Tanuma et al. |
| 2013/0228898 A1 | 9/2013 | Ide |
| 2019/0088581 A1* | 3/2019 | Yu ........................ H01L 21/4857 |
| 2019/0157209 A1* | 5/2019 | Wang .................. H01L 23/5386 |
| 2020/0211956 A1 | 7/2020 | Wu et al. |
| 2021/0066164 A1* | 3/2021 | Wu ........................ H01L 23/46 |
| 2021/0202336 A1 | 7/2021 | Chang et al. |

* cited by examiner

SEMICONDUCTOR PACKAGE INCLUDING INTERPOSER AND METHOD OF MANUFACTURING THE SEMICONDUCTOR PACKAGE

CROSS-REFERENCE TO RELATED APPLICATION

This application is a continuation of U.S. patent application Ser. No. 17/150,232, filed Jan. 15, 2021, in the U.S. Patent and Trademark Office, which is based on and claims priority under 35 U.S.C. § 119 to Korean Patent Application No. 10-2020-0084943, filed Jul. 9, 2020, in the Korean Intellectual Property Office, the entire contents of both of which are incorporated herein by reference.

BACKGROUND

The inventive concept relates to a semiconductor package including an interposer and a method of manufacturing the semiconductor package.

With the rapid development of the electronics industry and the demands of users, electronic devices are becoming more compact and multifunctional and have a large capacity. Accordingly, a semiconductor package including a plurality of semiconductor chips is demanded. As a plurality of semiconductor chips included in a semiconductor package are highly integrated, a printed circuit board is frequently unable to accommodate such a high density. To address this matter, a semiconductor package which uses an interposer to interconnect a plurality of semiconductor chips has been developed.

SUMMARY

The inventive concept provides a semiconductor package including an interposer and a method of manufacturing the semiconductor package.

According to an aspect of the inventive concept, there is provided a semiconductor package comprising a package substrate, a semiconductor chip on the package substrate, an interposer substrate on the semiconductor chip, the interposer substrate comprising a first surface facing the semiconductor chip and a trench in the first surface, the trench located to vertically overlap the semiconductor chip, and an insulating filler between the semiconductor chip and the interposer substrate, the insulating filler at least partially filling the trench of the interposer substrate.

Furthermore, according to an aspect of the inventive concept, there is provided a semiconductor package comprising a package substrate, a semiconductor chip on the package substrate, an interposer substrate comprising a base insulating layer, a lower protection insulating layer on a lower surface of the base insulating layer facing an upper surface of the semiconductor chip, and an upper protection insulating layer on an upper surface of the base insulating layer, a spacer on the lower protection insulating layer and protruding from the lower protection insulating layer toward the upper surface of the semiconductor chip, a conductive connector extending between the package substrate and the interposer substrate and electrically connecting the package substrate to the interposer substrate, and an insulating filler between the semiconductor chip and the interposer substrate and in contact with the conductive connector and the semiconductor chip, wherein the lower protection insulating layer comprises a trench vertically overlapping the upper surface of the semiconductor chip and at least partially filled with the insulating filler.

Furthermore, according to an aspect of the inventive concept, there is provided a semiconductor package comprising a first package substrate, a first semiconductor chip on the first package substrate, an interposer substrate on an upper surface of the first semiconductor chip, the interposer substrate comprising a first surface facing the first semiconductor chip and a trench in the first surface, the trench vertically overlapping the first semiconductor chip, a spacer on the first surface of the interposer substrate and contacting an upper surface of the first semiconductor chip, a first conductive connector extending between the first package substrate and the interposer substrate and electrically connecting the first package substrate to the interposer substrate, an insulating filler between the first semiconductor chip and the interposer substrate and within the trench of the interposer substrate, a second package substrate on the interposer substrate, a second semiconductor chip on the second package substrate, and a second conductive connector extending between the interposer substrate and the second package substrate and electrically connecting the interposer substrate to the second package substrate.

Furthermore, according to an aspect of the inventive concept, there is provided a method of manufacturing a semiconductor package, comprising providing a semiconductor chip on a package substrate, disposing an interposer on the package substrate and the semiconductor chip, the interposer being connected to the package substrate with a conductive connector, and forming an insulating filler to fill a gap between the package substrate and the interposer and a gap between the semiconductor chip and the interposer, wherein the interposer comprises a first side wall and a second side wall spaced apart in a first direction, and a trench provided in a first surface of the interposer that faces an upper surface of the semiconductor chip, the trench extending in the first direction, and wherein the forming of the insulating filler comprises injecting an insulating filling material in the first direction into the gap between the package substrate and the interposer.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
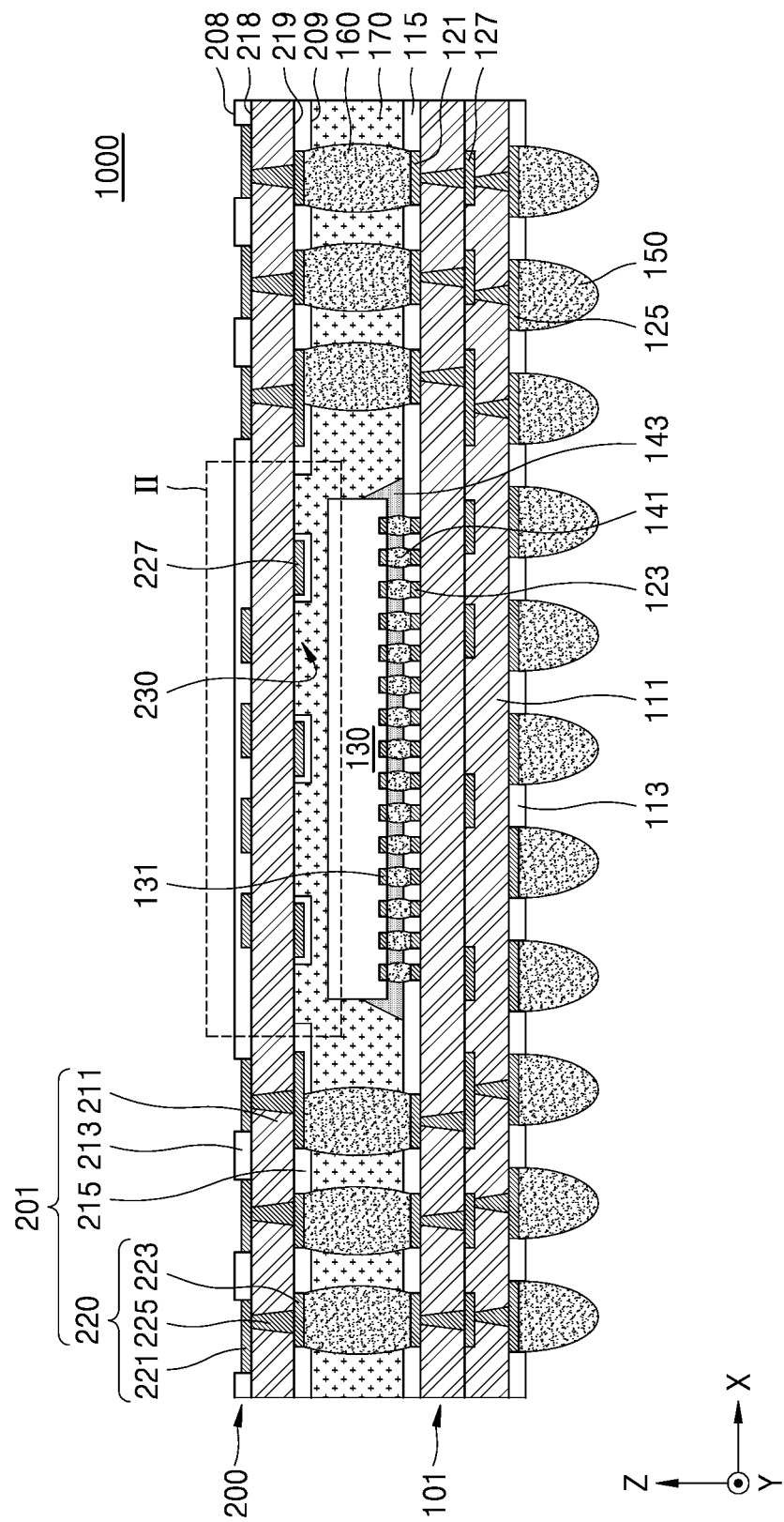
FIG. 1 is a cross-sectional view of a semiconductor package according to example embodiments of the inventive concept.

The disclosure will now be described more fully with reference to the accompanying drawings, in which embodiments of the disclosure are shown. Like reference numerals in the drawings denote like elements, and thus their description will not be repeated. It will be appreciated that description of a particular element (e.g., structure, relationships to other elements, etc.) in the singular will also be applicable to elements of the same type that may be depicted in the figures, unless context indicates otherwise.

Figure 2:
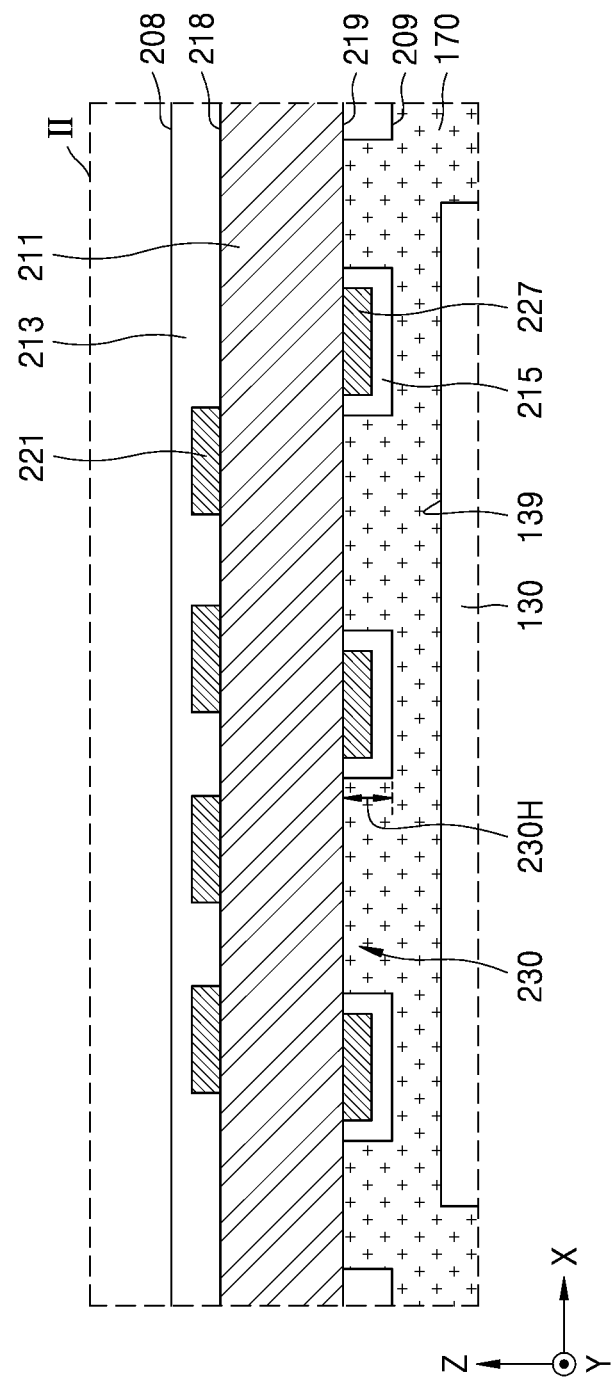
FIG. 2 is an enlarged view of a region II of FIG. 1.
Figure 3:
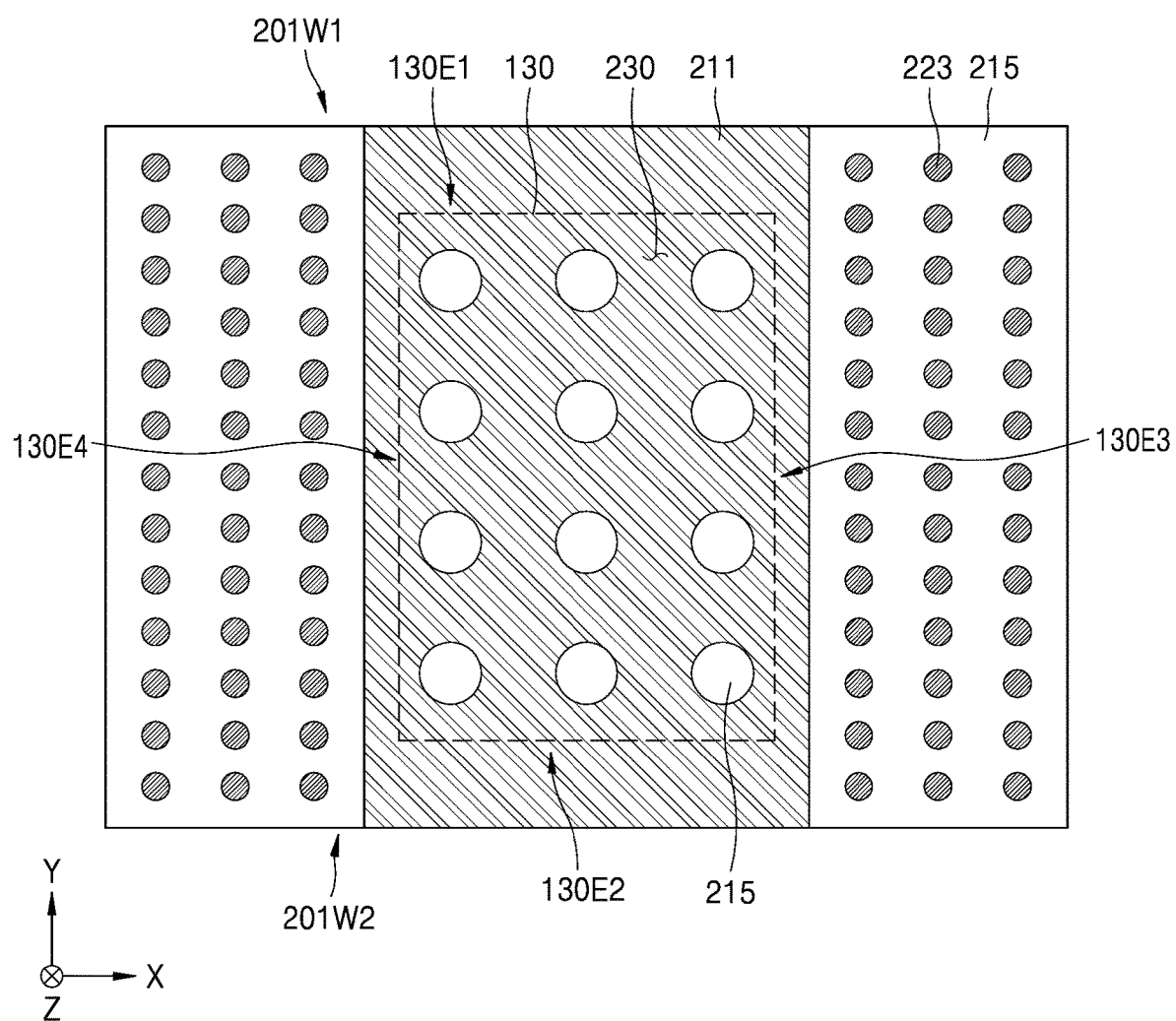
FIG. 3 is a bottom view of an interposer of FIG. 1.

FIG. 1 is a cross-sectional view of a semiconductor package 1000 according to example embodiments of the inventive concept. FIG. 2 is an enlarged view of a region II of FIG. 1. FIG. 3 is a bottom view of an interposer 200 of the semiconductor package 1000 of FIG. 1.

Referring to FIGS. 1 to 3, the semiconductor package 1000 may include a first package substrate 101, a first semiconductor chip 130, the interposer 200, and an insulating filler 170.

The first package substrate 101 may be, for example, a printed circuit board (PCB). The first package substrate 101 may include an insulative substrate base 111 formed of one or more insulating layers composed of, for example, at least one material selected from among phenol resin, epoxy resin, and polyimide. Furthermore, the first package substrate 101 may include a first upper substrate pad 121 and a second upper substrate pad 123, which are disposed on an upper surface of the substrate base 111, and a lower substrate pad 125 disposed on a lower surface of the substrate base 111. An inner wiring pattern 127 that electrically connects the first upper substrate pad 121, the second upper substrate pad 123, and the lower substrate pad 125 may be formed in the substrate base 111. Although the inner wiring pattern is shown as formed within one layer in FIG. 1, the inner wiring pattern 127 may be formed of several patterned conductive layers interconnected by conductive vias in substrate base 111. An upper substrate protection insulating layer 115 may be formed on an upper surface of the substrate base 111, and a lower substrate protection insulating layer 113 may be formed on a lower surface of the substrate base 111. The upper substrate protection insulating layer 115 and the lower substrate protection insulating layer 113 may be, for example, solder resist.

The first upper substrate pad 121, the second upper substrate pad 123, and the lower substrate pad 125 may be a conductive metal such as, for example, copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), ruthenium (Ru), and the like, or an alloy thereof, but the invention is not limited thereto.

The first upper substrate pad 121 may be a pad to which a substrate-interposer conductive connector 160 is attached, and the second upper substrate pad 123 may be a pad to which a chip connection bump 141 such as a micro-bump is attached. The substrate-interposer conductive connector 160 may be connected to the first upper substrate pad 121 through a first opening of the upper substrate protection insulating layer 115, and the chip connection bump 141 may be connected to the second upper substrate pad 123 through a second opening of the upper substrate protection insulating layer 115.

The lower substrate pad 125 may be a pad to which an external connection terminal 150 is attached. The external connection terminal 150 may be connected to the lower substrate pad 125 through an opening of the lower substrate protection insulating layer 113. The external connection terminal 150 may be, for example, a solder ball. The external connection terminal 150 may electrically connect the semiconductor package 1000 to an external device (e.g., mounting the semiconductor package 1000 to a printed circuit board (not shown) of an electronic system).

The first semiconductor chip 130 may be mounted on the first package substrate 101. The first semiconductor chip 130 may be disposed between the first package substrate 101 and the interposer 200 in a vertical direction (Z direction). The first semiconductor chip 130 may include a semiconductor substrate having an active side (sometimes referred to as an active surface) and an inactive side opposite to each other, and may include an integrated circuit (e.g., interconnected transistors, other active circuit elements and/or passive circuit elements) formed on the active side of the semiconductor substrate. The first semiconductor chip 130 may include a lower surface (corresponding to the active side) and an upper surface 139 (corresponding to the inactive side), which are opposite to each other, and a chip pad 131 may be provided on the lower surface of the first semiconductor chip 130. The chip pad 131 of the first semiconductor chip 130 may be electrically connected to the integrated circuit through a wiring structure (not shown) provided in the first semiconductor chip 130.

The first semiconductor chip 130, as a memory chip, may be a volatile memory chip and/or a non-volatile memory chip. The volatile memory chip may include, for example, dynamic random access memory (DRAM), static RAM (SRAM), thyristor RAM (TRAM), zero capacitor RAM (ZRAM), or twin transistor RAM (TTRAM). Furthermore, the non-volatile memory chip may include, for example, flash memory, magnetic RAM (MRAM), spin-transfer torque MRAM (STT-MRAM), ferroelectric RAM (FRAM), phase change RAM (PRAM), resistive RAM (RRAM), nanotube RRAM (nanotube RRAM), polymer RAM, or insulator resistance change memory.

The first semiconductor chip 130 may be a non-memory chip. For example, the first semiconductor chip 130, as a logic chip, may include, for example, an artificial intelligence semiconductor, a microprocessor, a graphics processor, a signal processor, a network processor, a chipset, an audio codec, a video codec, or an application processor, but the invention is not limited thereto. It will be appreciated that a non-memory chip (such as those mentioned here) will typically include memory (e.g., embedded memory acting as a cache, registers, etc.) and reference to a non-memory chip will be understood as not excluding memory from such a chip.

The first semiconductor chip 130 may be mounted on the first package substrate 101 in a face-down manner. In other words, the first semiconductor chip 130 may be mounted on the first package substrate 101 such that the active surface of the first semiconductor chip 130 provided with the chip pad 131 faces the first package substrate 101. The chip pad 131 of the first semiconductor chip 130 may be electrically connected to the second upper substrate pad 123 through the chip connection bump 141. The chip pad 131 of the first semiconductor chip 130 may be used as a terminal for transmitting an input/output signal (data signal, address signal, control signal, etc.) of the first semiconductor chip 130 or a terminal for providing power and/or ground to the first semiconductor chip 130.

An underfill material layer 143 surrounding the chip connection bump 141 may fill a gap between the first semiconductor chip 130 and the first package substrate 101. For example, the underfill material layer 143 may include epoxy resin formed in a capillary underfill method. The underfill material layer 143 may be a non-conductive layer. However, in some example embodiments, the insulating filler 170 may instead fill the gap between the first semiconductor chip 130 and the first package substrate 101. In this case, the underfill material layer 143 may be omitted.

The interposer 200 may be disposed on the first package substrate 101 and the first semiconductor chip 130. The interposer 200 may include an interposer substrate 201. The interposer substrate 201 may include a base insulating layer 211, an upper protection insulating layer 213, a lower protection insulating layer 215, and a wiring structure 220. The interposer substrate 201 may generally have a flat panel shape, and may include an upper surface 208 and a lower surface 209, which are opposite to each other.

The base insulating layer 211 may be formed of at least one material selected from among phenol resin, epoxy resin, and polyimide. For example, the base insulating layer 211 may be formed of one or more insulative layers formed of one or more materials selected from among polyimide, flame retardant 4 (FR-4), tetrafunctional epoxy, polyphenylene ether, epoxy/polyphenylene oxide, bismaleimide triazine (BT), thermount, cyanate ester, and liquid crystal polymer.

The wiring structure 220 may include an upper wiring pattern 221 on an upper surface 218 of the base insulating layer 211, a lower wiring pattern 223 on a lower surface 219 of the base insulating layer 211, and a conductive via 225 penetrating the base insulating layer 211. The upper wiring pattern 221 may include a pad to which a connector such as a solder ball and the like is attached. The lower wiring pattern 223 may include a pad to which the substrate-interposer conductive connector 160 for electrically connecting between the first package substrate 101 and the interposer 200 is attached. The conductive via 225 may be in contact with each of the upper wiring pattern 221 and the lower wiring pattern 223 and electrically connect the upper wiring pattern 221 to the lower wiring pattern 223. Although the base insulating layer 211 is shown as a single homogenous layer with wiring patterns 221, 223 formed on external surfaces, the base insulating layer 211 may be formed of several layers and have wiring patterns formed internal to the base insulating layer 211 to interconnect portions of upper wiring pattern 221 to the lower wiring pattern 223 (e.g., as shown and/or described with respect to substrate base 111, inner wiring pattern 127, the first upper substrate pad 121 and the second upper substrate pad 123 of package substrate 101.

The wiring structure 220 may include metal, for example, Cu, Al, W, Ti, Ta, In, Mo, Mn, Co, Sn, Ni, Mg, Re, Be, Ga, Ru, and the like, or an alloy thereof, but the invention is not limited thereto.

The upper protection insulating layer 213 may be disposed on the upper surface 218 of the base insulating layer 211, and the lower protection insulating layer 215 may be disposed on the lower surface 219 of the base insulating layer 211. The upper protection insulating layer 213 may be formed to cover the upper surface 218 of the base insulating layer 211 and a part of the upper wiring pattern 221. The lower protection insulating layer 215 may be formed to cover the lower surface 219 of the base insulating layer 211 and a part of the lower wiring pattern 223.

The substrate-interposer conductive connector 160 may be disposed between the interposer substrate 201 and the first package substrate 101. The substrate-interposer conductive connector 160 may have a column shape extending between the lower wiring pattern 223 of the interposer substrate 201 and the first upper substrate pad 121 of the first package substrate 101. The substrate-interposer conductive connector 160 may electrically connect between the lower wiring pattern 223 of the interposer substrate 201 and the first upper substrate pad 121 of the first package substrate 101.

The insulating filler 170 may be provided on the first package substrate 101. The insulating filler 170 may protect the first package substrate 101, the first semiconductor chip 130, the substrate-interposer conductive connector 160, and the interposer 200 from the external environment. The insulating filler 170 may be formed to cover at least a part of each of the first package substrate 101, the first semiconductor chip 130, the substrate-interposer conductive connector 160, and the interposer 200. For example, the insulating filler 170 may cover an upper surface of the first package substrate 101, a side wall and an upper surface of the first semiconductor chip 130, a side wall of the substrate-interposer conductive connector 160, and the lower surface 209 of the interposer substrate 201. Furthermore, the insulating filler 170 may be formed to fill a gap between the lower surface 209 of the interposer substrate 201 and the first semiconductor chip 130 and surround and encapsulate the substrate-interposer conductive connector 160.

In example embodiments, the insulating filler 170 may be an epoxy-based mold resin, a polyimide-based mold resin, and the like. For example, the insulating filler 170 may be an epoxy molding compound (EMC). In some examples, the insulating filler 170 may be a single homogenous material layer.

A trench 230 may be formed in the lower surface 209 of the interposer substrate 201. Note that as the trench 230 is formed in the lower surface 209 of the interposer substrate 201, the bottom of the trench 230 is located above the lowermost portions of lower surface 209 in FIG. 1. It should be appreciated that while the cross sectional views of FIGS. 1 and 2 show portions of trench(es) 230 separated from one another in the horizontal direction, these portions may form a single contiguous trench 230 (as shown in FIG. 3) or may form several discrete trenches 230. The trench 230 may define a space recessed from the lowermost surface of lower surface 209 of the interposer substrate 201. The trench 230 may be formed in an area of the interposer substrate 201 overlapping in the Z direction (perpendicular to the upper surface 139 of the first semiconductor chip 130). For example, in a plane view (such as that of FIG. 3), at least a part of the trench 230 may overlap the upper surface 139 of the first semiconductor chip 130. The trench 230 of the interposer substrate 201 may be at least partially filled by the insulating filler 170.

In example embodiments, the trench 230 may be formed in the lower protection insulating layer 215. For example, the trench 230 may have extend from a lower surface to an upper surface of the lower protection insulating layer 215 to penetrate the lower protection insulating layer 215, and the insulating filler 170 filling the trench 230 may be in contact with the lower surface 219 of the base insulating layer 211. In this case, an inner side wall of the lower protection insulating layer 215 may form a side wall of the trench 230, and a part of the lower surface 219 of the base insulating layer 211 may form the bottom surface of the trench 230. The trench 230 formed in the lower protection insulating layer 215 may define several discrete separate portions of the lower protection insulating layer 215 (e.g., disc shaped portions illustrated in FIG. 3).

In example embodiments, a lower conductive pattern 227 may be provided in the trench 230. The lower conductive pattern 227 and the lower wiring pattern 223 may be formed from (e.g., patterned from) different portions of the same conductive layer and thus formed of the same material composition. The lower conductive pattern 227 may be formed on the lower surface 219 of the base insulating layer 211, and may be covered by the lower protection insulating layer 215 in the trench 230. The lower conductive pattern 227 may be spaced apart from the insulating filler 170 with the lower protection insulating layer 215 formed therebetween. An upper surface of the lower conductive pattern 227 may be in contact with the base insulating layer 211, and a lower surface and a side wall of the lower conductive pattern 227 may be covered by the lower protection insulating layer 215. In some examples, lower conductive pattern 227 may have several discrete separate portions each being covered by a corresponding one of the discrete separate portions of the lower protection insulating layer 215 (e.g., may have a portion associated with and beneath the disc shaped portions of the lower protection insulating layer 215 with respect to the view illustrated in FIG. 3).

In example embodiments, the lower conductive pattern 227 may function as an electric connection path in the interposer 200, like the lower wiring pattern 223.

In example embodiments, the lower conductive pattern 227 may be a conductive dummy pattern that is not electrically connected to other wirings in the interposer 200. For example, when the lower conductive pattern 227 is a conductive dummy pattern, the lower conductive pattern 227 (as well as discrete elements of the lower conductive pattern 227) may be electrically floating.

In other example embodiments, unlike the illustrations of FIGS. 1 to 3, the lower conductive pattern 227 may be omitted in the trench 230. In this case, the lower protection insulating layer 215 that is provided in the trench 230 to cover at least a part of the lower conductive pattern 227 may be omitted.

In example embodiments, the trench 230 of the interposer substrate 201 may extend in a first horizontal direction (Y direction), as illustrated in FIG. 3. For example, the trench 230 may extend from a first side wall 201W1 of the interposer substrate 201 to a second side wall 201W2 opposite to the first side wall 201W1 to penetrate the interposer substrate 201 in the first horizontal direction (Y direction).

In example embodiments, the width of the trench 230 of the interposer substrate 201 may be greater than the width of the upper surface 139 of the first semiconductor chip 130. For example, when the upper surface 139 of the first semiconductor chip 130 includes a first edge 130E1 and a second edge 130E2 spaced apart each other in the first horizontal direction (Y direction), and a third edge 130E3 and a fourth edge 130E4 spaced apart each other in a second horizontal direction (X direction) perpendicular to the first horizontal direction (Y direction). The width of the trench 230 in the first horizontal direction (Y direction) may be greater than the width of the upper surface 139 of the first semiconductor chip 130 in the first horizontal direction (Y direction). The width of the trench 230 in the second horizontal direction (X direction) may be greater than the width of the upper surface 139 of the first semiconductor chip 130 in the second horizontal direction (X direction).

In other example embodiments, while the width of the trench 230 in the first horizontal direction (Y direction) is greater than the width of the upper surface 139 of the first semiconductor chip 130 in the first horizontal direction (Y direction), the width of the trench 230 in the second horizontal direction (X direction) may be less than the width of the upper surface 139 of the first semiconductor chip 130 in the second horizontal direction (X direction).

In example embodiments, in order to manufacture the semiconductor package 1000, operations of disposing the first semiconductor chip 130 on the first package substrate 101, disposing the interposer 200 on the first package substrate 101 and the first semiconductor chip 130 by using the substrate-interposer conductive connector 160, and forming the insulating filler 170 filling a gap between the first package substrate 101 and the interposer 200 and a gap between the first semiconductor chip 130 and the interposer 200 may be sequentially performed.

In example embodiments, to form the insulating filler 170, a supply process of supplying an insulating filling material forming the insulating filler 170 between the first package substrate 101 and the interposer 200, and a curing process of curing the insulating filling material, may be performed.

In the supply process to form the insulating filler 170, the insulating filling material may be injected in one direction, and the injected insulating filling material may flow between the interposer 200 and the first package substrate 101 in an injection direction. In example embodiments, the insulating filling material may be injected in an extension direction of the trench 230 of the interposer substrate 201. As illustrated in FIG. 3, when the trench 230 of the interposer substrate 201 extends in the first horizontal direction (Y direction), the insulating filling material may be supplied to flow in the first horizontal direction (Y direction), in a gap between the interposer 200 and the first package substrate 101 and a gap between the interposer 200 and the first semiconductor chip 130. For example, the insulating filling material may be supplied toward the second side wall 201W2 of the interposer substrate 201 to flow in the first horizontal direction (Y direction), between the interposer 200 and the first package substrate 101 and between the interposer 200 and the first semiconductor chip 130.

The trench 230 of the interposer substrate 201 increases a space or gap between the interposer substrate 201 and the first semiconductor chip 130 where the insulating filling material may flow, thereby increasing the fluidity of the insulating filling material. Accordingly, the incomplete filling of the insulating filler 170 between the interposer substrate 201 and the first semiconductor chip 130, and the generation of voids due to the incomplete filling, may be prevented and/or reduced.

In example embodiments, a height 230H of the trench 230 of the interposer substrate 201, that is, a depth of the trench 230 being recessed from the lowermost surface of lower surface 209 of the interposer substrate 201, may be between about 20 μm to about 25 μm. When the height 230H of the trench 230 is less than 20 μm, the fluidity of the insulating filler 170 is insufficient so that voids may be excessively generated between the interposer substrate 201 and the first semiconductor chip 130. When the height 230H of the trench 230 is greater than 25 μm, the thickness of the lower protection insulating layer 215 increases to meet the required height of the trench 230, and thus, it may be difficult to implement miniaturizations of the interposer 200 and the semiconductor package 1000.

Figure 4:
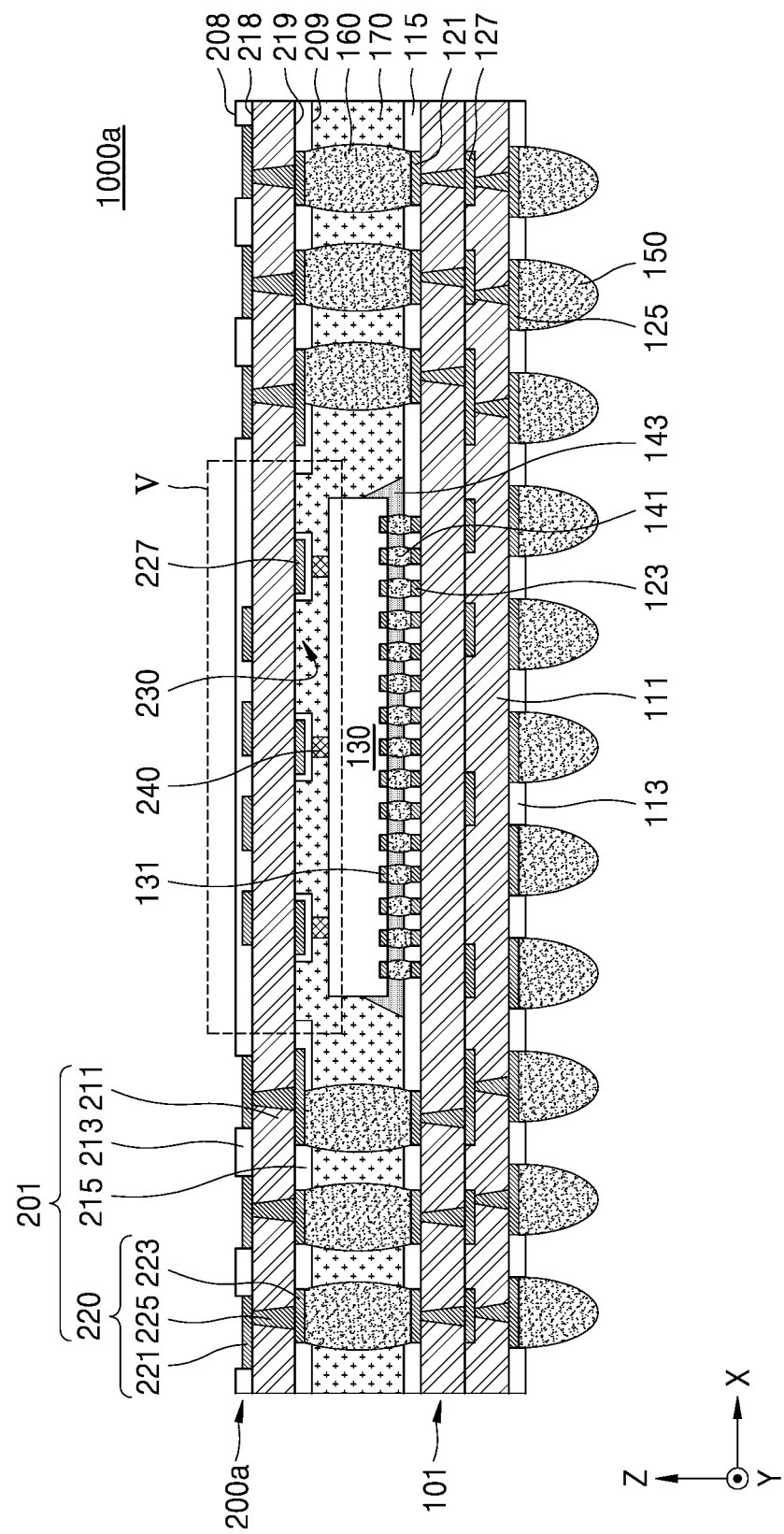
FIG. 4 is a cross-sectional view of a semiconductor package according to example embodiments of the inventive concept.
Figure 5:
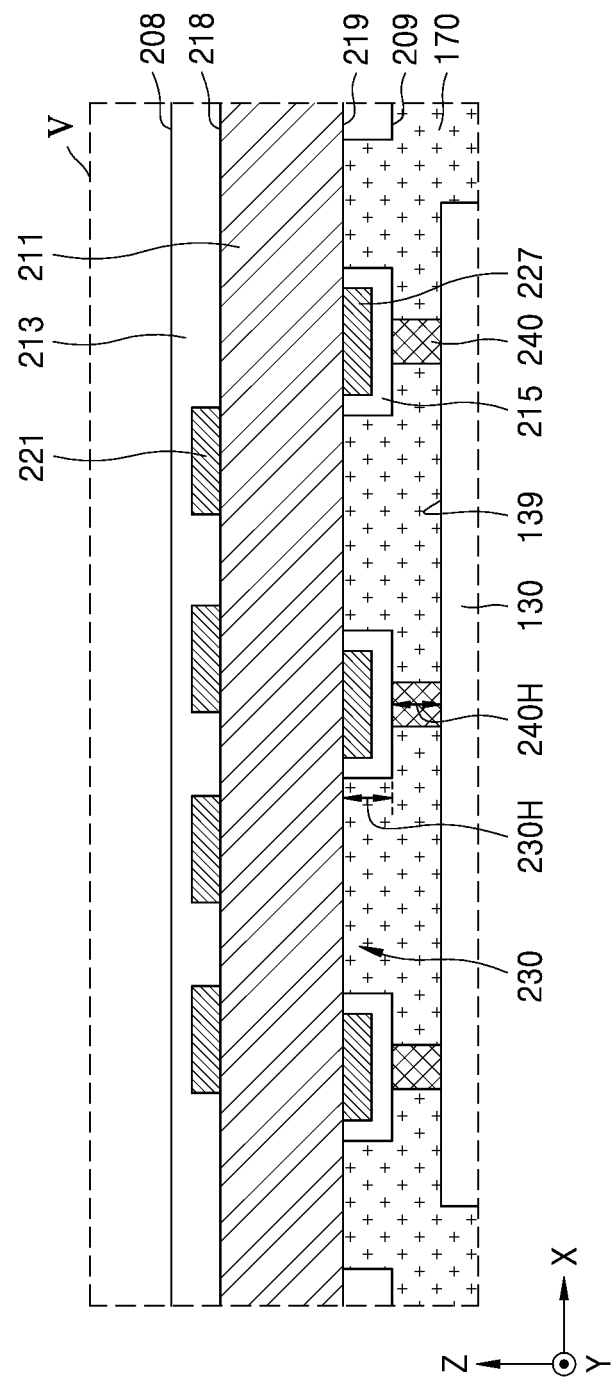
FIG. 5 is an enlarged view of a region V of FIG. 4.
Figure 6:
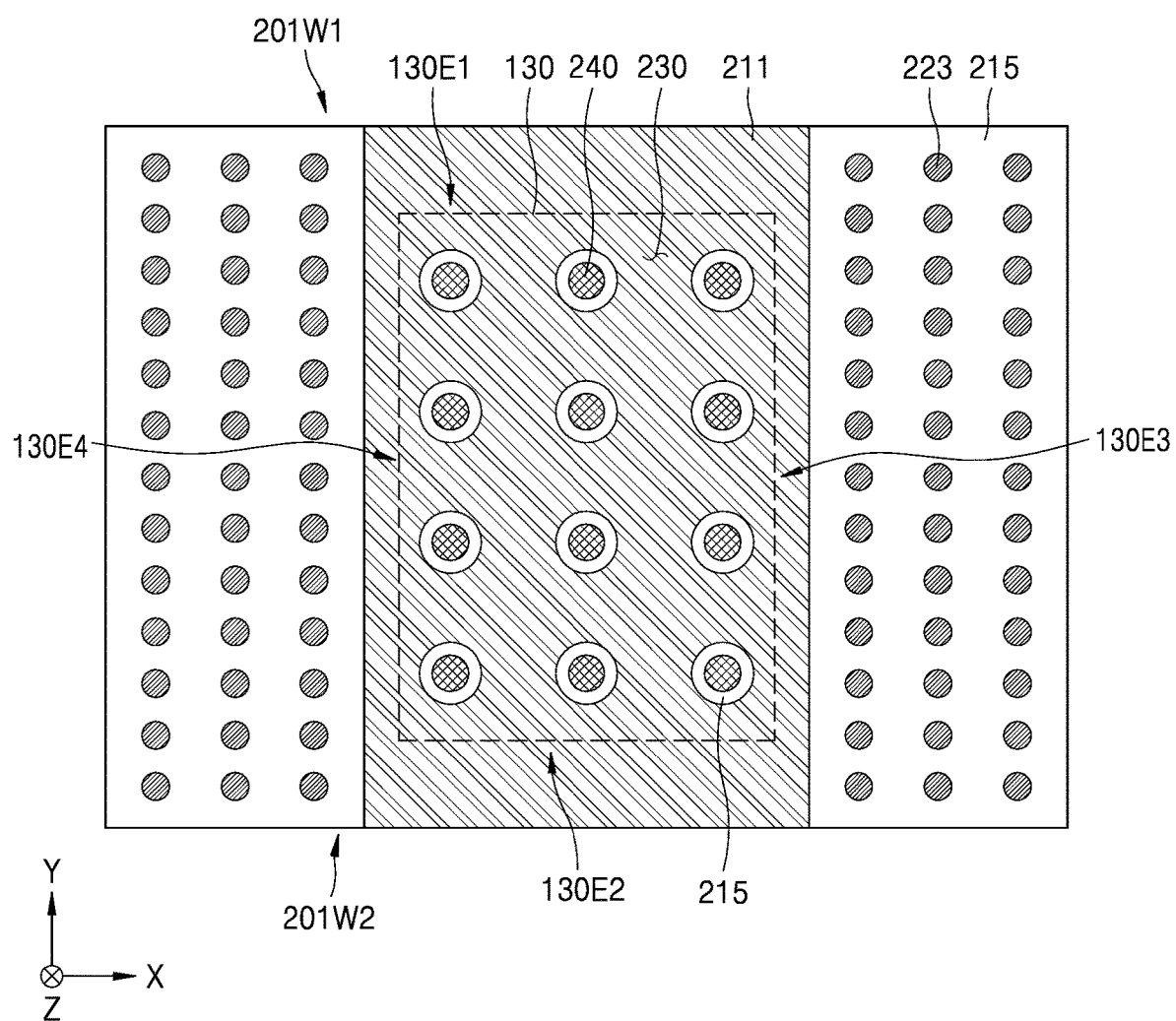
FIG. 6 is a bottom view of an interposer of FIG. 4.

FIG. 4 is a cross-sectional view of a semiconductor package 1000a according to example embodiments of the inventive concept. FIG. 5 is an enlarged view of a region V of FIG. 4. FIG. 6 is a bottom view of an interposer 200a of FIG. 4.

The semiconductor package 1000a of FIGS. 4 to 6 may be generally the same as or similar to the semiconductor package 1000 described with reference to FIGS. 1 to 3, except that the interposer 200a further includes a spacer 240. For convenience of explanation, the differences from the semiconductor package 1000 described with respect to FIGS. 1 to 3 are mainly described below and repetitive description may therefore be omitted.

Referring to FIGS. 4 to 6, the interposer 200a may include the spacer 240 disposed on the lower surface 209 of the interposer substrate 201. The spacer 240 may have a column shape protruding downward from the lower surface 209 of the interposer substrate 201 toward the first semiconductor chip 130.

In example embodiments, a plurality of spacers 240 may be disposed on the lower surface 209 of the interposer substrate 201. For example, as illustrated in FIG. 6, the spacers 240 may be located within the outer boundaries of the trench 230 and arranged in a two-dimensional array. A lower surface of each of the spacers 240 may be in contact with the upper surface 139 of the first semiconductor chip 130, an upper surface of each of the spacers 240 may be in contact with the lower protection insulating layer 215, and a side wall of each of the spacers 240 may be covered by the insulating filler 170 such that the spacers 240 are surrounded by the insulating filler 170 (with respect to a plan view).

The spacer 240 may space the lower surface 209 of the interposer substrate 201 apart from the upper surface 139 of the first semiconductor chip 130. A spacing between the lower surface 209 of the interposer substrate 201 and the upper surface 139 of the first semiconductor chip 130 may be equal to or greater than a height 240H of the spacer 240.

During a formation process of the insulating filler 170, the spacer 240 may support the interposer substrate 201 such that the lower surface 209 of the interposer substrate 201 is spaced apart from the upper surface 139 of the first semiconductor chip 130. In the injection process to form the insulating filler 170, the spacer 240 may define a minimum spacing between the lowermost surface of lower surface 209 of the interposer substrate 201 and the upper surface 139 of the first semiconductor chip 130.

In example embodiments, the height 240H of the spacer 240 protruding from the lower surface 209 of the interposer substrate 201 may be between about 20 μm to about 40 μm. When the height 240H of the spacer 240 is less than 20 μm, the minimum spacing between the lower surface 209 of the interposer substrate 201 and the upper surface 139 of the first semiconductor chip 130 is too small so that the insulating filling material may not flow between the interposer substrate 201 and the first semiconductor chip 130. When the height 240H of the spacer 240 is greater than 40 μm, the total thickness of the semiconductor package 1000a increases so that it may be difficult to implement the miniaturization of the semiconductor package 1000a.

In general, the gap between the lower surface 209 of the interposer substrate 201 and the upper surface 139 of the first semiconductor chip 130 is filled with an underfill material, the minimum spacing between the lower surface 209 of the interposer substrate 201 and the first semiconductor chip 130 to prevent the incomplete filling of the underfill material may be at least 30 μm. However, according to example embodiments of the present inventive concept, as the interposer substrate 201 includes the trench 230 which may increase the fluidity of the insulating filling material, even when the minimum spacing between the lower surface 209 of the interposer substrate 201 and the first semiconductor chip 130 is less than 30 μm, the incomplete filling of the insulating filler 170 may be prevented.

In example embodiments, the spacer 240 may be formed of the same material as that of the lower protection insulating layer 215. For example, the spacer 240 may be formed of a solder resist. For example, to form the spacer 240, a solder resist material layer covering the lower surface 219 of the base insulating layer 211 may be formed, and a patterning process may be performed on the solder resist material layer.

In example embodiments, the spacer 240 may include a different material from the lower protection insulating layer 215. For example, the lower protection insulating layer 215 may be a solder resist, and the spacer 240 may include epoxy-based resin or polyimide-based resin. For example, the spacer 240 may be a dot-type (e.g., spherical) structure that is attached to a lower surface of the lower protection insulating layer 215 located in the trench 230.

Figure 7:
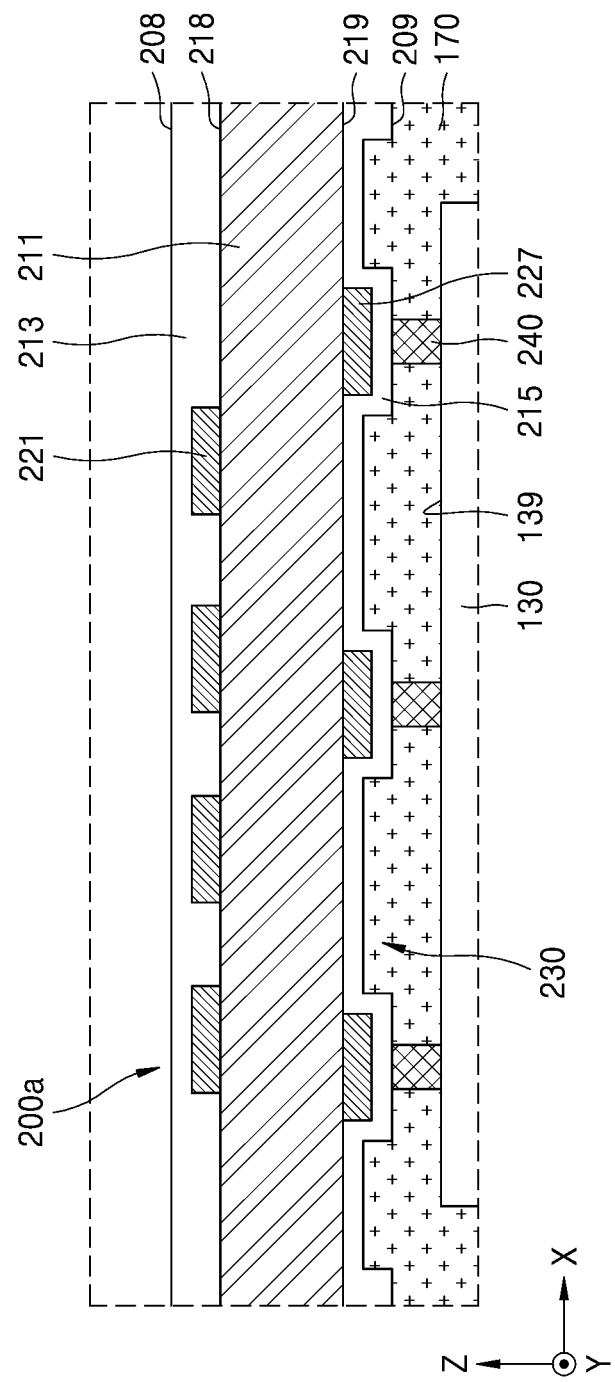
FIG. 7 is a cross-sectional view of a portion of a semiconductor package according to example embodiments of the inventive concept.

FIG. 7 is a cross-sectional view of a portion of a semiconductor package according to example embodiments of the inventive concept. In FIG. 7, a portion of a semiconductor package corresponding to the region V of FIG. 4 is illustrated. The differences from the semiconductor package 1000a described with reference to FIGS. 4 to 6 are mainly described below and thus repetitive description may be omitted.

Referring to FIG. 7, the trench 230 may be formed in the lower protection insulating layer 215, and may partially penetrate the lower protection insulating layer 215 from the lowermost surface of the lower protection insulating layer 215. In other words, the trench 230 does not penetrate the entire lower protection insulating layer 215 in the vertical direction (Z direction), and an area overlapping the trench 230 in the lower surface 219 of the base insulating layer 211 may be covered by the lower protection insulating layer 215. In this case, the side wall and the bottom surface of the trench 230 may be formed by a surface of the lower protection insulating layer 215.

Figure 8:
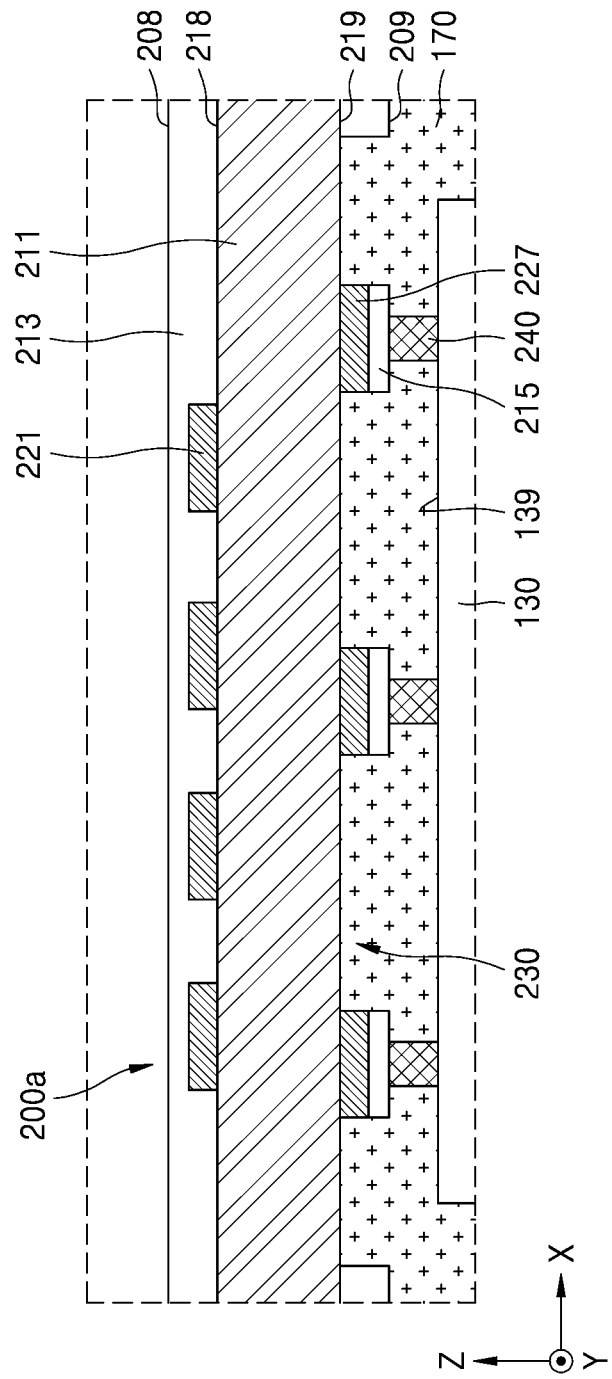
FIG. 8 is a cross-sectional view of a portion of a semiconductor package according to example embodiments of the inventive concept.

FIG. 8 is a cross-sectional view of a portion of a semiconductor package according to example embodiments of the inventive concept. In FIG. 8, a portion of a semiconductor package corresponding to the region V of FIG. 4 is illustrated. The differences from the semiconductor package 1000a described with reference to FIGS. 4 to 6 are mainly described below and thus repetitive description may be omitted.

Referring to FIG. 8, the lower conductive pattern 227 provided in the trench 230 may be in contact with the insulating filler 170 filling the trench 230. In example embodiments, the lower conductive pattern 227 may include an upper surface in contact with the base insulating layer 211, a lower surface in contact with the lower protection insulating layer 215, and a side wall in contact with the insulating filler 170.

Figure 9:
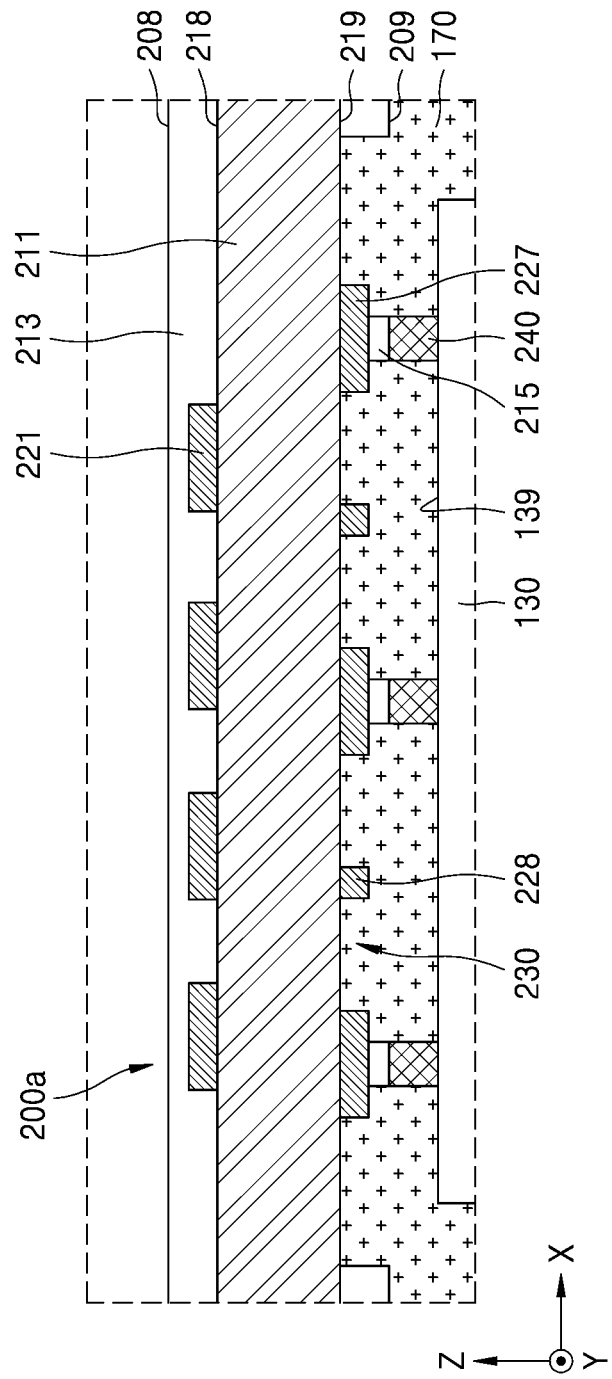
FIG. 9 is a cross-sectional view of a portion of a semiconductor package according to example embodiments of the inventive concept.

FIG. 9 is a cross-sectional view of a portion of a semiconductor package according to example embodiments of the inventive concept. In FIG. 9, a portion of a semiconductor package corresponding to the region V of FIG. 4 is illustrated. The differences from the semiconductor package 1000a described with reference to FIGS. 4 to 6 are mainly described below and thus repetitive description may be omitted.

Referring to FIG. 9, the lower conductive pattern 227 may be located to overlap the spacer 240 in the vertical direction, and an additional lower conductive pattern 228 may be provided that is spaced apart from the spacer 240 in the horizontal direction. The lower wiring pattern 223, the lower conductive pattern 227 and the additional lower conductive pattern 228 may be formed from (e.g., patterned from) different portions of the same conductive layer and thus be formed of the same material composition. The additional lower conductive pattern 228 spaced apart from the spacer 240 in the horizontal direction may not be covered by the lower protection insulating layer 215. The lower conductive pattern 227 located to overlap the spacer 240 in the vertical direction may include an upper surface in contact with the base insulating layer 211, a lower surface in contact with the lower protection insulating layer 215 and the insulating filler 170, and a side wall in contact with the insulating filler 170. The additional lower conductive pattern 228 spaced apart from the spacer 240 in the horizontal direction may include an upper surface in contact with the base insulating layer 211 and a lower surface and a side wall in contact with the insulating filler 170.

Figure 10:
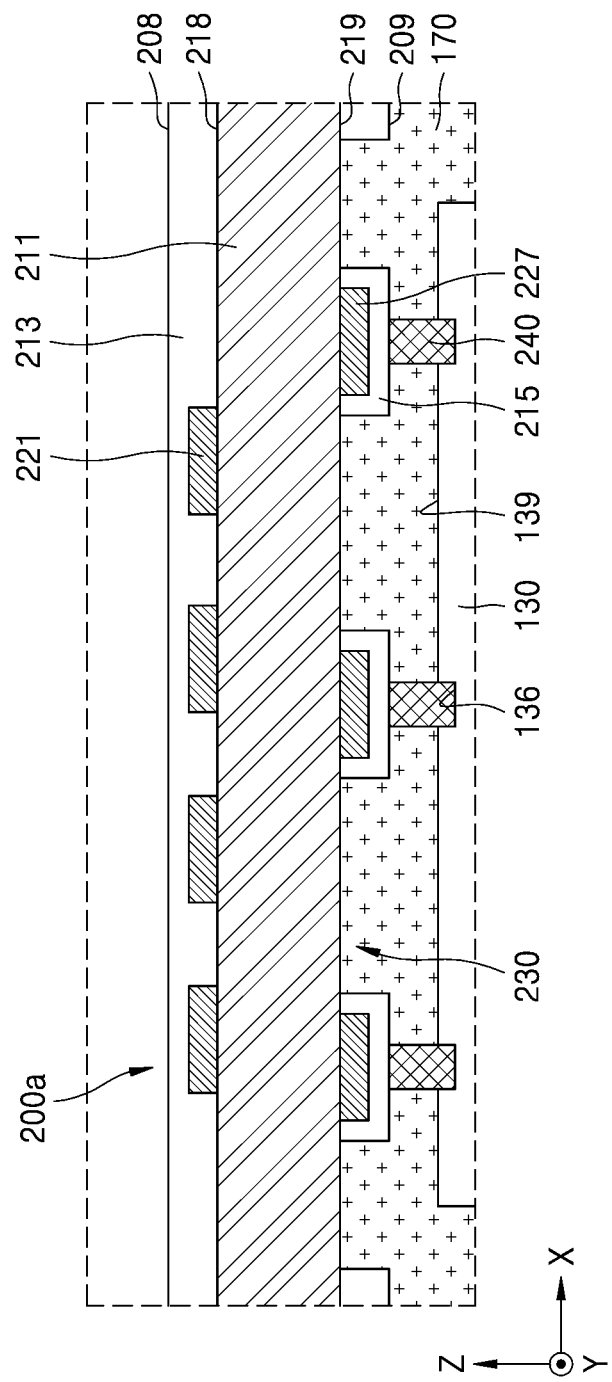
FIG. 10 is a cross-sectional view of a portion of a semiconductor package according to example embodiments of the inventive concept.

FIG. 10 is a cross-sectional view of a portion of a semiconductor package according to example embodiments of the inventive concept. In FIG. 10, a portion of a semiconductor package corresponding to the region V of FIG. 4 is illustrated. The differences from the semiconductor package 1000a described with reference to FIGS. 4 to 6 are mainly described below and thus repetitive description may be omitted.

Referring to FIG. 10, the first semiconductor chip 130 may include a recess 136 formed to accommodate a part of the spacer 240 of the interposer 200a. The recess 136 of the first semiconductor chip 130 may be provided in the upper surface 139 of the first semiconductor chip 130. The recess 136 of the first semiconductor chip 130 may be located to correspond to the spacer 240 of the interposer 200a such that a part of the spacer 240 of the interposer 200a is inserted therein, and may have a shape corresponding to the spacer 240 of the interposer 200a. As the spacer 240 of the interposer 200a is inserted into the recess 136 of the first semiconductor chip 130, the interposer 200a may be firmly fixed to the first semiconductor chip 130. Furthermore, as the spacer 240 of the interposer 200a is inserted into the recess 136 of the first semiconductor chip 130, the interposer 200a may be aligned with the first semiconductor chip 130, and thus misalignment between the interposer 200a and the first semiconductor chip 130 may be prevented.

Figure 11:
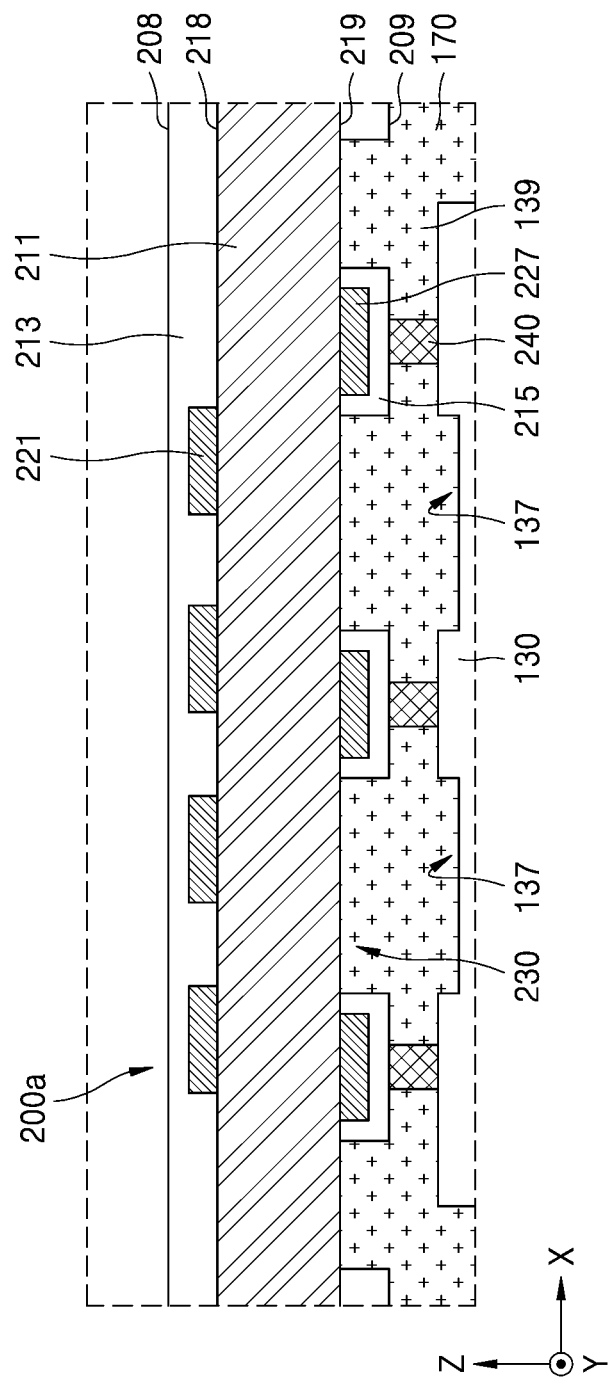
FIG. 11 is a cross-sectional view of a portion of a semiconductor package according to example embodiments of the inventive concept.

FIG. 11 is a cross-sectional view of a portion of a semiconductor package according to example embodiments of the inventive concept. In FIG. 11, a portion of a semiconductor package corresponding to the region V of FIG. 4 is illustrated. The differences from the semiconductor package 1000a described with reference to FIGS. 4 to 6 are mainly described below and thus repetitive description may be omitted.

Referring to FIG. 11, a chip trench 137 may be formed in the upper surface 139 of the first semiconductor chip 130. The chip trench 137 may define a space recessed from the uppermost surface of upper surface 139 of the first semiconductor chip 130. The chip trench 137 may be formed by removing, for example, a part of the semiconductor substrate of the first semiconductor chip 130. In example embodiments, the chip trench 137 of the first semiconductor chip 130 may extend from the first edge 130E1 of the upper surface 139 of the first semiconductor chip 130 (see FIG. 6) to the second edge 130E2 (see FIG. 6) in the first horizontal direction (Y direction).

The chip trench 137 may be at least partially filled with the insulating filler 170 that fills a gap between the interposer 200a and the first semiconductor chip 130. The chip trench 137 of the first semiconductor chip 130, in cooperation with the trench 230 of the interposer substrate 201, may increase a space or spacing between the interposer substrate 201 and the first semiconductor chip 130, in which the insulating filling material may flow, to thus increase the fluidity of the insulating filling material during the formation process of the insulating filler 170. Accordingly, incomplete filling of the insulating filler 170 between the interposer substrate 201 and the first semiconductor chip 130 may be prevented and/or reduced, and thus the generation of voids between the interposer substrate 201 and the first semiconductor chip 130 due to the incomplete filling may be prevented and/or reduced.

Figure 12:
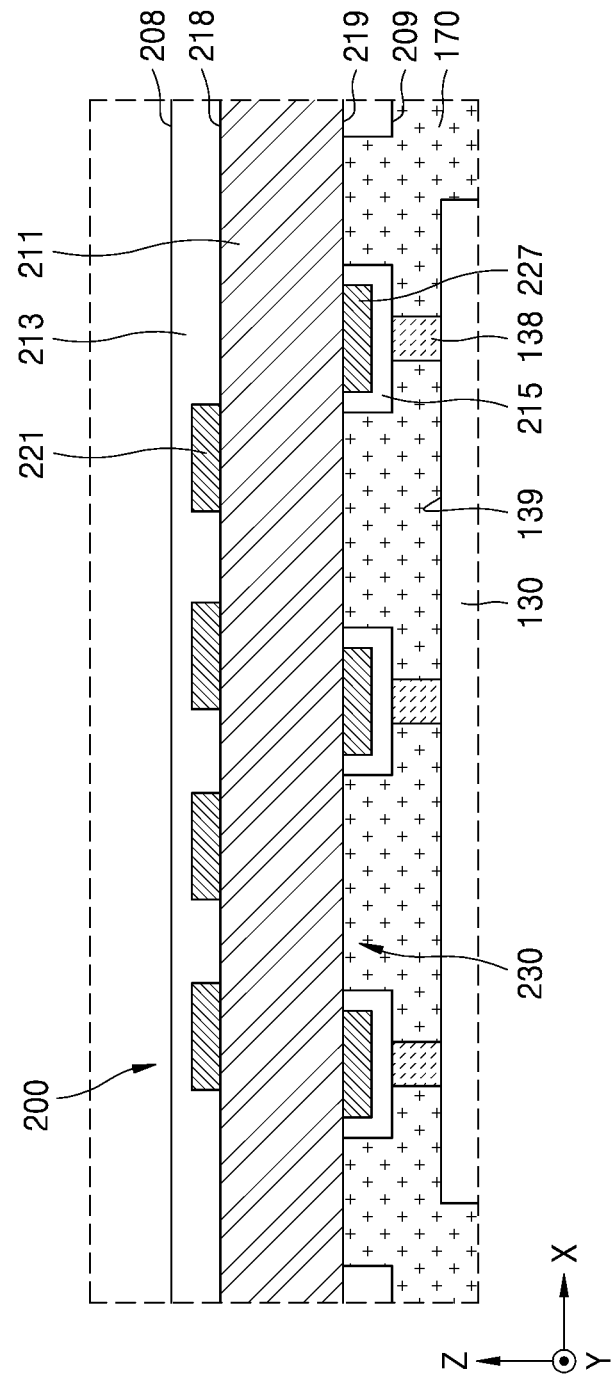
FIG. 12 is a cross-sectional view of a portion of a semiconductor package according to example embodiments of the inventive concept.

FIG. 12 is a cross-sectional view of a portion of a semiconductor package according to example embodiments of the inventive concept. In FIG. 12, a portion of a semiconductor package corresponding to the region II of FIG. 1 is illustrated. The differences from the semiconductor package 1000 described with reference to FIGS. 1 to 3 are mainly described below and thus repetitive description may be omitted.

Referring to FIG. 12, the first semiconductor chip 130 may include a chip spacer 138 provided with the upper surface 139 of the first semiconductor chip 130. The chip spacer 138 may have a column shape protruding from the upper surface 139 of the first semiconductor chip 130 toward the lower surface 209 of the interposer substrate 201. In example embodiments, a plurality of chip spacers 138 may be provided with the upper surface 139 of the first semiconductor chip 130. An upper surface of each of the chip spacers 138 may be in contact with the lower surface 209 (e.g., lowermost portion of lower surface 209) of the interposer substrate 201, and a side wall of each of the chip spacers 138 may be covered with the insulating filler 170. The chip spacer 138, similar to the spacer 240 of the interposer substrate 201 described with reference to FIGS. 4 to 6, may separate the lower surface 209 of the interposer substrate 201 and the remaining portions of upper surface 139 of the first semiconductor chip 130 from each other, and may define a minimum spacing between the lower surface 209 of the interposer substrate 201 and the remaining portions of upper surface 139 of the first semiconductor chip 130. In some examples, the chip spacer 138 may be formed by processing the inactive side of first semiconductor chip 130 at a wafer level process (during manufacturing of the first semiconductor chip prior to singulating the first semiconductor chip 130 from the wafer). For example, chip spacer 138 may be formed by patterning the inactive side of the semiconductor chip 130 (e.g., a selective etch back process) where the chip spacer 138 is formed from portions of the substrate of the first semiconductor chip 130. In other examples, the chip spacer 138 may be formed from a patterned or molded layer added to the substrate of the first semiconductor chip 130 at the inactive side of the first semiconductor chip 130. For example, the chip spacers 138 may be formed by blanket depositing an insulating layer on the inactive side the substrate of the first semiconductor chip 130, such layer being patterned to form chip spacers 138. For example, the chip spacers 138 may be formed by selective epitaxially growth within a patterned mold formed on the inactive side of the substrate of the first semiconductor chip 130. Chip spacers may be selectively epitaxially grown within openings of the patterned mold (that expose the substrate 130 of the first semiconductor chip 130 so as to use the same as a seed in the epitaxial growth process). The chip spacer 138 may be formed of the same crystalline semiconductor material as the substrate of the first semiconductor chip 130 (e.g., both formed of crystalline silicon). The patterned mold may be subsequently removed to leave the chip spacers 138 extending above the substrate of the first semiconductor chip 130. After formation of the chip spacers 138 on the inactive side of the substrate of the first semiconductor chip 130 at the wafer level, the first semiconductor chip 130 may be singulated (e.g., cut from) the wafer.

In some example embodiments, (not shown in FIG. 12), the first semiconductor chip 130 may include the chip spacer 138, and the interposer 200 may also include the spacer 240 of FIGS. 4 to 6. For example, in FIG. 12, the chip spacer 138 disposed at the central portion of the upper surface 139 of the first semiconductor chip 130 may be omitted and replaced with a spacer 240 of the interposer 200 (disposed at the position where the chip spacer 138 has been omitted). In this case, the chip spacer 138 of the first semiconductor chip 130 and the spacer 240 of the interposer 200 may cooperatively separate the lower surface 209 of the interposer substrate 201 and the upper surface 139 of the first semiconductor chip 130 from each other.

Figure 13:
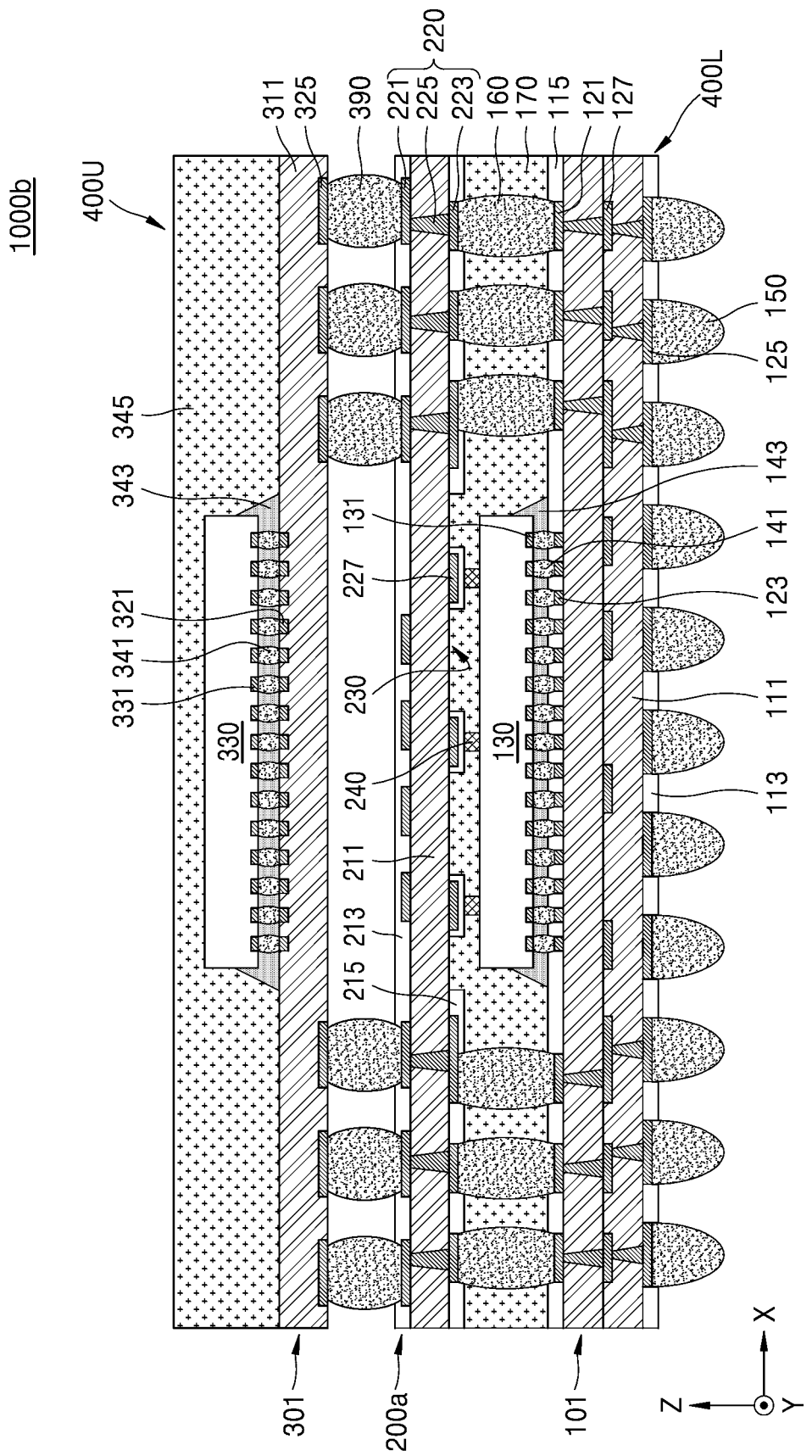
FIG. 13 is a cross-sectional view of a semiconductor package according to example embodiments of the inventive concept.

FIG. 13 is a cross-sectional view of a semiconductor package 1000b according to example embodiments of the inventive concept.

Referring to FIG. 13, the semiconductor package 1000b may include a lower package 400L and an upper package 400U. The semiconductor package 1000b may be a package-on-package type semiconductor package in which the upper package 400U is stacked on the lower package 400L.

Although FIG. 13 illustrates that the lower package 400L corresponds to the semiconductor package 1000a described above with reference to FIGS. 4 to 6, the lower package 400L may correspond to the semiconductor package 1000 described with reference to FIGS. 1 to 3 or any one of the semiconductor packages described herein (e.g., with reference to FIGS. 7 to 12).

The upper package 400U may include a second package substrate 301, a second semiconductor chip 330, and a molding layer 345. The second package substrate 301 may be, for example, a printed circuit board. The second package substrate 301 may include a substrate base 311 having one or more layers formed of at least one material selected from among phenol resin, epoxy resin, and polyimide. Furthermore, the second package substrate 301 may include an upper substrate pad 321 disposed on an upper surface of the substrate base 311 and a lower substrate pad 325 disposed on a lower surface of the substrate base 311. An inner wiring configured to electrically connect the upper substrate pad 321 to the lower substrate pad 325 may be formed in the substrate base 311.

The second package substrate 301 may be mounted on the interposer 200a through an inter-package conductive connector 390. The inter-package conductive connector 390 may be connected to each of the upper wiring pattern 221 of the interposer 200a and the lower substrate pad 325 of the second package substrate 301, thereby electrically connecting the upper wiring pattern 221 of the interposer 200a to the lower substrate pad 325 of the second package substrate 301.

The second semiconductor chip 330 may be disposed on the second package substrate 301. For example, a chip pad 331 of the second semiconductor chip 330 may be electrically connected to the upper substrate pad 321 of the second package substrate 301 via a chip connection bump 341. An underfill material layer 343 surrounding the chip connection bump 341 may be disposed between the second semiconductor chip 330 and the second package substrate 301.

In example embodiments, the first semiconductor chip 130 and the second semiconductor chip 330 may be heterogeneous semiconductor chips. For example, when the first semiconductor chip 130 is a logic chip, the second semiconductor chip 330 may be a memory chip. In example embodiments, the semiconductor package 1000b may include different types of semiconductor chips, components such as passive elements, and the like, which are electrically connected to each other and configured to operate as one system.

The molding layer 345 may be disposed on the second package substrate 301 to cover at least a part of the second semiconductor chip 330. The molding layer 345 may include, for example, epoxy-based mold resin, polyimide-based mold resin, and the like. For example, the molding layer 345 may be an epoxy molding compound.

According to the example embodiments of the present inventive concept, as the interposer 200a includes the trench 230 filled with the insulating filler 170, the generation of voids between the interposer 200a and the first semiconductor chip 130 may be prevented and/or reduced. Accordingly, the reliability of the semiconductor package 1000b including the interposer 200a may be improved.

While the inventive concept has been particularly shown and described with reference to embodiments thereof, it will be understood that various changes in form and details may be made therein without departing from the spirit and scope of the following claims.

What is claimed is:

1. A semiconductor package comprising:
   a package substrate;
   an interposer substrate on the package substrate; and
   a semiconductor chip between the package substrate and the interposer substrate, the semiconductor chip comprising a first chip trench in an upper surface of the semiconductor chip facing the interposer substrate; and
   an insulating filler between the semiconductor chip and the interposer substrate, the insulating filler covering the upper surface of the semiconductor chip,
   wherein the insulating filler extends to the first chip trench of the semiconductor chip and fills the first chip trench of the semiconductor chip, the insulating filler covering a bottom surface and side surfaces of the first chip trench of the semiconductor chip.

2. The semiconductor package of claim 1,
   wherein the upper surface of the semiconductor chip comprises a first edge and a second edge opposite to each other, and
   wherein the first chip trench of the semiconductor chip extends from the first edge of the upper surface of the semiconductor chip to the second edge of the upper surface of the semiconductor chip.

3. The semiconductor package of claim 1,
   wherein the semiconductor chip further comprises a second chip trench spaced apart from the first chip trench, and wherein the insulating filler at least partially fills the second chip trench of the semiconductor chip.

4. The semiconductor package of claim 1, wherein the first chip trench of the semiconductor chip is defined by a surface of a semiconductor substrate of the semiconductor chip.

5. The semiconductor package of claim 1,
wherein the interposer substrate comprises a trench in a first surface of the interposer substrate facing the semiconductor chip, the trench vertically overlapping the semiconductor chip, and
wherein the insulating filler at least partially fills the trench of the interposer substrate.

6. The semiconductor package of claim 5, wherein the trench of the interposer substrate vertically overlaps the first chip trench of the semiconductor chip.

7. The semiconductor package of claim 5,
wherein the interposer substrate comprises a first side wall and a second side wall opposite to each other, and
wherein the trench of the interposer substrate extends from the first side wall of the interposer substrate to the second side wall of the interposer substrate.

8. The semiconductor package of claim 5, wherein the interposer substrate comprises:
a base insulating layer; and
a lower protection insulating layer on a lower surface of the base insulating layer facing the semiconductor chip,
wherein the trench of the interposer substrate is provided in the lower protection insulating layer.

9. The semiconductor package of claim 8,
wherein the trench of the interposer substrate penetrates the lower protection insulating layer, and
wherein the insulating filler is in contact with the base insulating layer.

10. The semiconductor package of claim 1, further comprising:
a spacer on a first surface of the interposer substrate facing the semiconductor chip,
wherein the spacer protrudes from the first surface of the interposer substrate toward the semiconductor chip and is in contact with the semiconductor chip.

11. The semiconductor package of claim 10, wherein the interposer substrate comprises:
a base insulating layer; and
a lower protection insulating layer on a lower surface of the base insulating layer facing the semiconductor chip,
wherein the spacer is in contact with the lower protection insulating layer.

12. The semiconductor package of claim 11, wherein a material of the spacer is same as a material of the lower protection insulating layer.

13. The semiconductor package of claim 11, wherein a material of the spacer is different from a material of the lower protection insulating layer.

14. The semiconductor package of claim 10, wherein the spacer is spaced apart from the first chip trench of the semiconductor chip.

15. A semiconductor package comprising:
a package substrate;
an interposer substrate on the package substrate, the interposer substrate comprising a base insulating layer, a lower protection insulating layer on a lower surface of the base insulating layer, and an upper protection insulating layer on an upper surface of the base insulating layer;
a conductive connector extending between the package substrate and the interposer substrate and electrically connecting the package substrate with the interposer substrate;
a semiconductor chip between the package substrate and the interposer substrate; and
an insulating filler between the semiconductor chip and the interposer substrate and in contact with the conductive connector and the semiconductor chip,
wherein the lower protection insulating layer comprises a trench at least partially filled with the insulating filler, and
wherein the semiconductor chip comprises an upper surface and a chip trench in the upper surface,
wherein the insulating filler extends to the chip trench and covers a bottom surface and side surfaces of the chip trench, the chip trench being filled with the insulating filler.

16. The semiconductor package of claim 15,
wherein the interposer substrate comprises a first side wall and a second side wall opposite to each other in a first horizontal direction,
wherein the trench of the interposer substrate extends in the first horizontal direction from the first side wall of the interposer substrate to the second side wall of the interposer substrate opposite to the first side wall,
wherein the upper surface of the semiconductor chip comprises a first edge and a second edge opposite to each other in the first horizontal direction, and
wherein the chip trench of the semiconductor chip extends in the first horizontal direction from the first edge of the upper surface of the semiconductor chip to the second edge of the upper surface of the semiconductor chip.

17. The semiconductor package of claim 15, wherein the trench of the interposer substrate vertically overlaps the chip trench of the semiconductor chip.

18. The semiconductor package of claim 15, further comprising a spacer extending from the lower protection insulating layer to the upper surface of the semiconductor chip.

19. The semiconductor package of claim 18, wherein the lower protection insulating layer and the spacer comprise solder resist.

20. A semiconductor package comprising:
a first package substrate;
a first semiconductor chip on the first package substrate, the first semiconductor chip comprising an upper surface and a chip trench in the upper surface;
an interposer substrate on the upper surface of the first semiconductor chip, the interposer substrate comprising a first surface facing the first semiconductor chip and a trench in the first surface located to vertically overlap the first semiconductor chip;
a spacer on the first surface of the interposer substrate and in contact with the upper surface of the first semiconductor chip;
a first conductive connector extending between the first package substrate and the interposer substrate and electrically connecting the first package substrate with the interposer substrate;
an insulating filler between the first semiconductor chip and the interposer substrate and filling the chip trench of the first semiconductor chip and the trench of the interposer substrate;
a second package substrate on the interposer substrate;
a second semiconductor chip on the second package substrate; and a second conductive connector extending between the interposer substrate and the second package substrate and electrically connecting the interposer substrate with the second package substrate.

\* \* \* \* \*